(12) United States Patent
LeFebvre et al.

(10) Patent No.: US 9,769,960 B2
(45) Date of Patent: Sep. 19, 2017

(54) DATA CENTER HEAT REMOVAL SYSTEMS AND METHODS

(71) Applicants: Dale LeFebvre, St. Thomas, VI (US); Kenneth Choi, San Francisco, CA (US)

(72) Inventors: Dale LeFebvre, St. Thomas, VI (US); Kenneth Choi, San Francisco, CA (US)

(73) Assignees: Dale LeFebvre, St. Thomas, VA (US); Kenneth Choi, San Francisco, CA (US)

( * ) Notice: Subject to any disclaimer, the term of this patent is extended or adjusted under 35 U.S.C. 154(b) by 62 days.

(21) Appl. No.: 14/984,149

(22) Filed: Dec. 30, 2015

(65) Prior Publication Data

US 2016/0192542 A1     Jun. 30, 2016

Related U.S. Application Data

(60) Provisional application No. 62/098,176, filed on Dec. 30, 2014.

(51) Int. Cl.
    *H05K 7/20*     (2006.01)
(52) U.S. Cl.
    CPC ..... *H05K 7/20745* (2013.01); *H05K 7/20827* (2013.01); *H05K 7/20836* (2013.01)
(58) Field of Classification Search
    CPC ................ H05K 7/20745; H05K 7/20836
    See application file for complete search history.

(56) References Cited

U.S. PATENT DOCUMENTS

| | | |
|---|---|---|
| 7,173,820 B2 | 2/2007 | Fink et al. |
| 7,604,535 B2 | 10/2009 | Germagian et al. |
| 7,864,530 B1 | 1/2011 | Hamburgen et al. |
| 7,881,057 B2 | 2/2011 | Fink et al. |
| 7,961,463 B2 | 6/2011 | Belady et al. |

(Continued)

FOREIGN PATENT DOCUMENTS

CN     204026888 U     12/2014

OTHER PUBLICATIONS

Dunlap et al., "Adaptations in Data-Center Cooling," Schneider Electric, West Kingston, R.I., May 1, 2012, <<http://mepinsider.blogspot.com/2012/08/adaptations-in-data-center-cooling.html, 4 pages.

(Continued)

*Primary Examiner* — Hoa C Nguyen
*Assistant Examiner* — Keith Depew
(74) *Attorney, Agent, or Firm* — Sprinkle IP Law Group

(57) ABSTRACT

New data center heat removal systems and methods allow a combination of active and passive thermal processes for removing heat from and cooling air in data center environments. Systems and methods include a data center heat removal system including an adjustable thermal feed cold air intake system, a distribution system for cold and warm air including one or more hot aisles and one or more cold aisles, and a convection system to draw cool air through data center equipment using a naturally-occurring convection processes to expel hot air. Misters, cooling elements, and/or freezer boxes may further cool the intake of air. A controller is programmed to efficiently manage and control the climate (e.g., temperature, humidity, air flow, pressure, air quality, etc.) within a data center to minimize the use for energy for air distribution and cooling.

19 Claims, 10 Drawing Sheets

(56) References Cited

U.S. PATENT DOCUMENTS

| | | | |
|---|---|---|---|
| 8,180,495 B1 | 5/2012 | Roy | |
| 8,266,921 B2 | 9/2012 | Tashiro | |
| 8,498,114 B2 | 7/2013 | Martini | |
| 8,523,643 B1* | 9/2013 | Roy | G06F 1/20 |
| | | | 454/184 |
| 8,636,565 B2 | 1/2014 | Carlson et al. | |
| 8,764,528 B2 | 7/2014 | Tresh et al. | |
| 8,842,433 B2* | 9/2014 | Koblenz | H05K 7/20836 |
| | | | 361/679.47 |
| 8,857,120 B2 | 10/2014 | Marrs et al. | |
| 8,974,274 B2* | 3/2015 | Carlson | H05K 7/20827 |
| | | | 165/222 |
| 9,069,534 B2* | 6/2015 | Rogers | H05K 7/20745 |
| 9,141,155 B2 | 9/2015 | Wiley | |
| 9,144,181 B2 | 9/2015 | Wiley | |
| 9,278,303 B1* | 3/2016 | Somani | B01D 47/06 |
| 9,313,929 B1* | 4/2016 | Malone | H05K 7/20836 |
| 9,439,329 B1* | 9/2016 | Towner | H05K 7/1497 |
| 9,445,531 B1* | 9/2016 | Heydari | H05K 7/20827 |
| 2006/0126296 A1 | 6/2006 | Campbell et al. | |
| 2008/0311836 A1 | 12/2008 | Bhattacharya | |
| 2009/0198388 A1* | 8/2009 | Hillis | H05K 7/1497 |
| | | | 700/300 |
| 2010/0263825 A1* | 10/2010 | Noteboom | H05K 7/20736 |
| | | | 165/47 |
| 2011/0009047 A1 | 1/2011 | Noteboom et al. | |
| 2011/0063792 A1 | 3/2011 | Schmidt et al. | |
| 2011/0105015 A1 | 5/2011 | Carlson | |
| 2011/0127027 A1* | 6/2011 | Kashirajima | F24F 3/065 |
| | | | 165/286 |
| 2011/0128699 A1 | 6/2011 | Heydari et al. | |
| 2011/0175498 A1* | 7/2011 | Bash | F24F 11/0001 |
| | | | 312/107 |
| 2011/0195652 A1 | 8/2011 | Smith | |
| 2011/0256822 A1* | 10/2011 | Carlson | H05K 7/20827 |
| | | | 454/184 |
| 2012/0087087 A1 | 4/2012 | Nicolai et al. | |
| 2012/0164930 A1 | 6/2012 | Murayama et al. | |
| 2012/0309284 A1 | 12/2012 | Dernis et al. | |
| 2013/0040547 A1 | 2/2013 | Moore | |
| 2013/0111937 A1* | 5/2013 | Hendrix | G06F 1/20 |
| | | | 62/127 |
| 2013/0244563 A1 | 9/2013 | Noteboom et al. | |
| 2014/0133089 A1 | 5/2014 | Wiley | |
| 2014/0331582 A1 | 11/2014 | Klaba | |
| 2014/0340842 A1* | 11/2014 | Towner | F24F 6/02 |
| | | | 361/679.48 |
| 2015/0334881 A1* | 11/2015 | Romanos Tabuenca | G06F 1/20 |
| | | | 62/115 |
| 2016/0085277 A1* | 3/2016 | Samadiani | G06F 1/20 |
| | | | 361/679.53 |

OTHER PUBLICATIONS

"Data Center Aisle Containment Strategies," retrieved on Sep. 28, 2015, <<http://www.42u.com/cooling/data-center-containment-strategies.htm, 7 pages.

Albert Ahdoot, "Is Hot or Cold Aisle Containment Right for Your Data Center?" Data Center News, Nov. 5, 2014, <<http://www.colocationamerica.com/blog/hot-vs-cold-aisle-containment, 5 pages.

International Search Report and Written Opinion issued for PCT Application No. PCT/US2015/068039, dated Mar. 4, 2016, 10 pages.

International Search Preliminary Report on Patentability issued for PCT Application No. PCT/US2015/068039, dated Jul. 13, 2017, 10 pages.

* cited by examiner

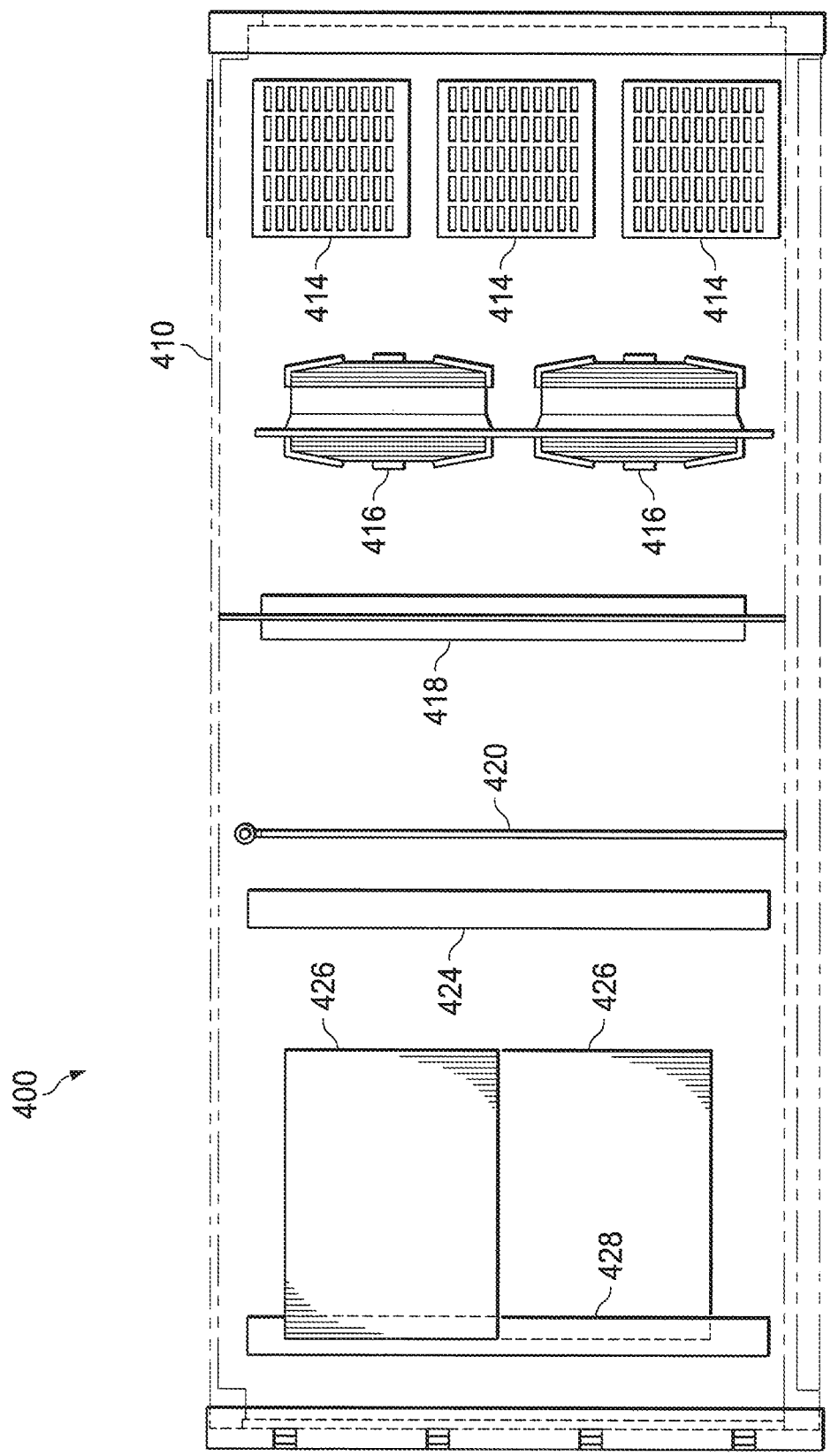

DATA CENTER HEAT REMOVAL SYSTEMS AND METHODS

CROSS-REFERENCE TO RELATED APPLICATION(S)

This is a conversion of, and claims a benefit of priority under 35 U.S.C. §119 from Provisional Application No. 62/098,176, entitled "DATA CENTER HEAT REMOVAL SYSTEMS AND METHODS," filed Dec. 30, 2014, which is hereby fully incorporated by reference in its entirety, including appendices.

COPYRIGHT NOTICE

A portion of the disclosure of this patent document contains material which is subject to copyright protection. The copyright owner has no objection to the facsimile reproduction by any one of the patent document or the patent disclosure, as it appears in the Patent and Trademark Office patent file or records, but otherwise reserves all copyright rights whatsoever.

TECHNICAL FIELD

This disclosure relates generally to data centers. More particularly, this disclosure relates to new, improved systems and methods for cooling data center servers and removal of heat from data centers.

BACKGROUND

A data center is a facility used to house computer systems and associated components such as air conditioning systems. Large scale data centers can include hundreds of servers and can require as much energy as a small town to power the data center computer equipment and cooling equipment.

As such, energy usage consumed by data centers is a major cost consideration. Energy costs in data centers arise from computing, networking activities, and power transformations that use energy and, as a byproduct, generate heat. However, a majority of energy costs is associated with the removal of heat from the data center. Active heat management equipment (i.e., air conditioning systems) is substantially less than 100% efficient, which means heat monitoring and management equipment adds to the data center heat removal problems because they generate heat through their own operation.

In a conventional data center environment, desired temperatures are maintained using heating, ventilation, air conditioning (HVAC). Typically, the ambient temperature is monitored by a thermostat, which turns the heat or air conditioning on and off to maintain the temperature set by the thermostat.

SUMMARY OF THE DISCLOSURE

Embodiments provide systems and methods to allow a combination of active and passive thermal data center processes for removing heat from data center environments having computing equipment, networking equipment, and/or power distribution systems.

In some embodiments, a data center heat removal system may include an adjustable thermal feed cold air intake system, a distribution system for cold and warm air including one or more hot aisles and one or more cold aisles, and a convection system to draw cool air through data center equipment using a naturally-occurring convection processes to expel hot air. That is, some embodiments utilize passive pressure differences to expel hot air and bring in cool air, either alone or in combination with active use of fans or other air circulation devices. In addition, some embodiments may use heat exchangers.

In some embodiments, these components are interchangeable and modular and are the basis of a novel solution that provides an efficient method of removing heat from a data center.

Embodiments utilize natural convection for heat removal from a data center including using the pressure differential between a hot aisle and a cold aisle. Embodiments may also use cold air from misters and/or freezer boxes for the intake of cold air. Some embodiments may use a natural process to form two distinct pressure regions in the data center. Some embodiments may use natural processes to maximize the air pressure differential between the cold aisle input of an individual server and its output to the warm aisle. Some embodiments allow natural process-driven multi-stage air cooling.

Advantageously, embodiments efficiently manage the climate (which can include temperature, humidity, air flow, and air quality, etc.) within a data center and minimize the use for energy for air distribution. Some embodiments minimize the use of active heat management equipment that generates heat through their own operation. Some embodiments minimize and eliminate the use of moving cooling parts. Some embodiments minimize maintenance costs associated with server heating and cooling. Some embodiments manage the costs of computing services.

In some embodiments, a system for data center heat removal includes an adjustable pressure feed cold air intake system; one or more heat exchangers; a distribution system for cold and warm air (cool aisles and warm aisles); and a convection system to draw cool air through data center equipment along with embedded server fans. The system further may make use of naturally-occurring convection processes to expel hot air, thus creating a relative vacuum to draw in cool air (and may optimally use an adjustable fan for disposing of warm air). Thus, embodiments may include a sealed warm low pressure area and a cold pressure area.

Some embodiments may automatically utilize convection for cooling. Some embodiments are designed to allow multi-stage cooling. Some embodiments utilize pressure to expel hot air and draw in cool air. Numerous additional embodiments are also possible.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features.

FIGS. 4-7 are views of an exemplary chilling unit according to some embodiments.

DETAILED DESCRIPTION

Figure 1:
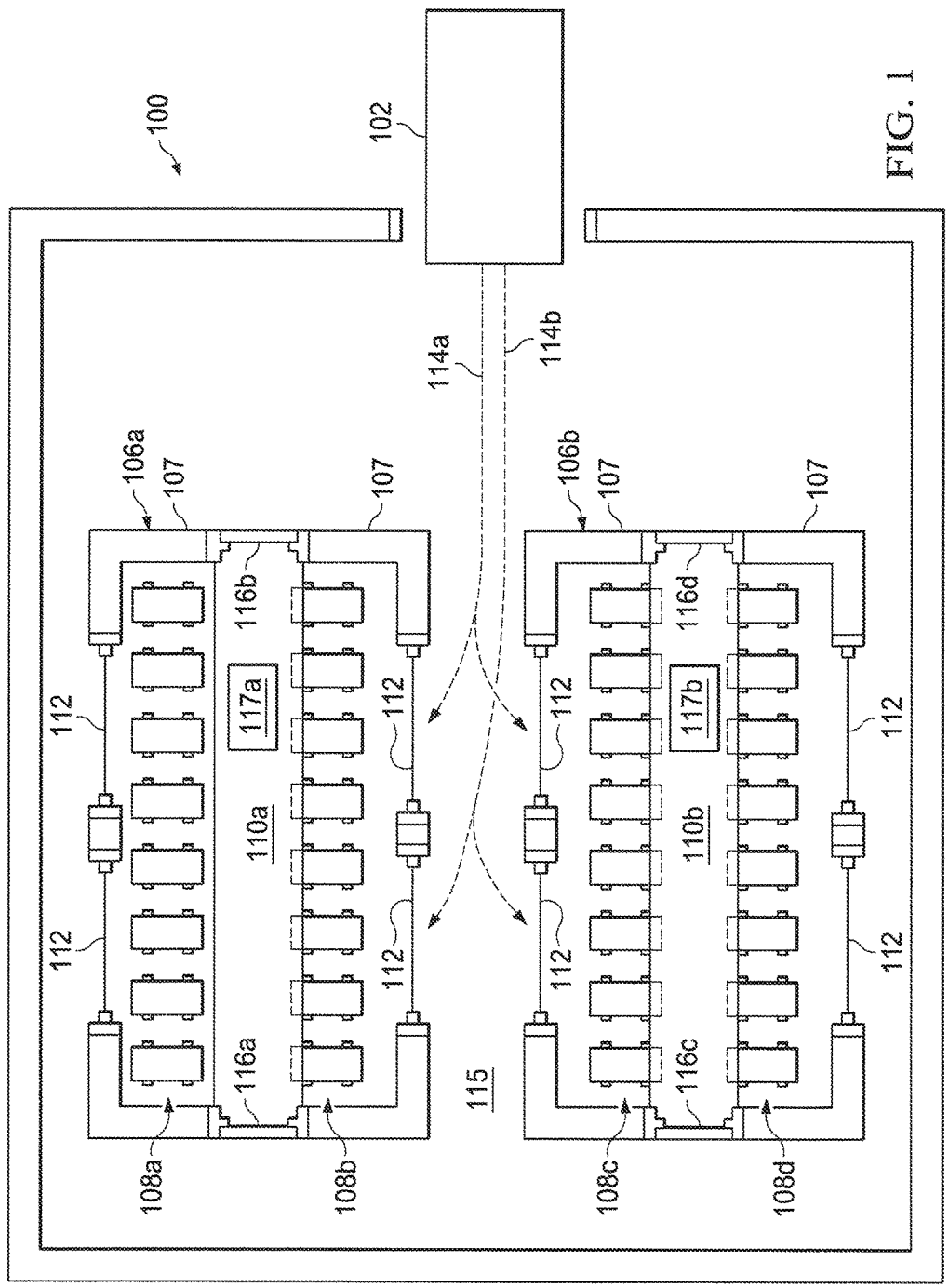
FIG. 1 depicts a diagram illustrating an exemplary data center heat removal system configured for a data center and having a chilling unit according to some embodiments.

Following is a description of one exemplary data center environment in which a heat removal system may be implemented according to some embodiments. FIG. 1 depicts a diagram schematically illustrating a layout of a data center heat removal system according to some embodiments. In the example of FIG. 1, a data center heat removal system for a data center 100 includes a chilling unit 102. As will be described in greater detail below, the chilling unit 102 may include a housing, one or more fans or similar devices configured for drawing in air from outside the data center, one or more misters for cooling the air, and one or more chiller units for further reducing the air temperature.

The data center 100 may include one or more server pods 106a and 106b. The server pods 106a and 106b may be embodied as self-contained rooms or enclosures that have walls 107, doors 116a, 116b, 116c, 116d, and ceilings (not shown). The server pods 106a and 106b are configured to house one or more banks of servers 108a, 108b and 108c, and 108d, respectively. The server banks 108a, 108b and 108c, and 108d may comprise racks of servers mounted on above each other. It is noted that while two server pods are illustrated, in practice, a data center may employ many more. Thus, the figures are by way of example only.

The server pods 106a and 106b include openings 112 for drawing in cool air from the chilling unit 102 via one or more "cold aisles" 115. Additional cold aisles may be formed between other server pods, in the example where the data center includes numerous server pods. The server pods 106a and 106b may further be configured such that banks of servers 108a and 108b (and similarly, server banks 108c and 108d) are separated by a "hot aisle" 110a and 110b, respectively. In operation, cold air is drawn in from the cold aisle(s) 115 and flows across the server banks 108a and 108b (and similarly, server banks 108c and 108d), where the air is heated by the servers. The heated air, isolated in the hot aisles 110a and 110b, is then drawn up and out through vents 117a and 117b in the ceiling of the respective pods 106a and 106b. The heated air escaping from the hot aisles 110a and 110b will yield lower pressure in the hot aisles 110a and 110b, causing cool air to be drawn from the cold aisle(s) 115. The air circulation can be controlled by varying the volume of air allowed through the supply side or through the exhaust side or both (described in detail below).

Accordingly, air heated by the server banks 108a, 108b and 108c, and 108d will rise to the top of the pods 106a and 106b via natural convection and be vented through vents 117a and 117b. Some embodiments provide a sealed hood for the hot air flows (see e.g., the hood 211 shown in FIG. 2). In some embodiments, additional fans may be provided in or in conjunction with the vents 117a and 117b to assist in drawing out the heated air and/or to maintain a desired pressure differential.

As illustrated by the exemplary flow lines in FIG. 1 (represented by lines 114a and 114b), air flows from the chilling unit 102 into one or more cold aisles 115, from which they are drawn into the server pods 106a and 106b via openings 112. Inside the server pods 106a and 106b, internal fans of the servers (not shown) may draw the air across the servers and out into the hot aisles 110a and 110b. From the hot aisles 110a and 110b, the heated air is vented through the vents 117a and 117b.

In some embodiments, the vents 117a and 117b may be provided with or associated with fans that draw air up into them. In some embodiments, the fans are coupled to or controlled by one or more pressure sensors, which can be utilized to ensure that the pressure in the hot aisles 110a and 110b is lower than the pressure in the cold aisles 115. For example, if the pressure in the hot aisle 110a or 110b is detected as being the same or higher than the pressure in the cold aisle 115, the respective fans may be operated at a higher speed to draw more air in the hot aisles 110a and 110b up for venting through the vents 117a and 117b. This ensures that a desired pressure differential, and/or a desired air flow rate, can be maintained or otherwise controlled.

Figure 2:
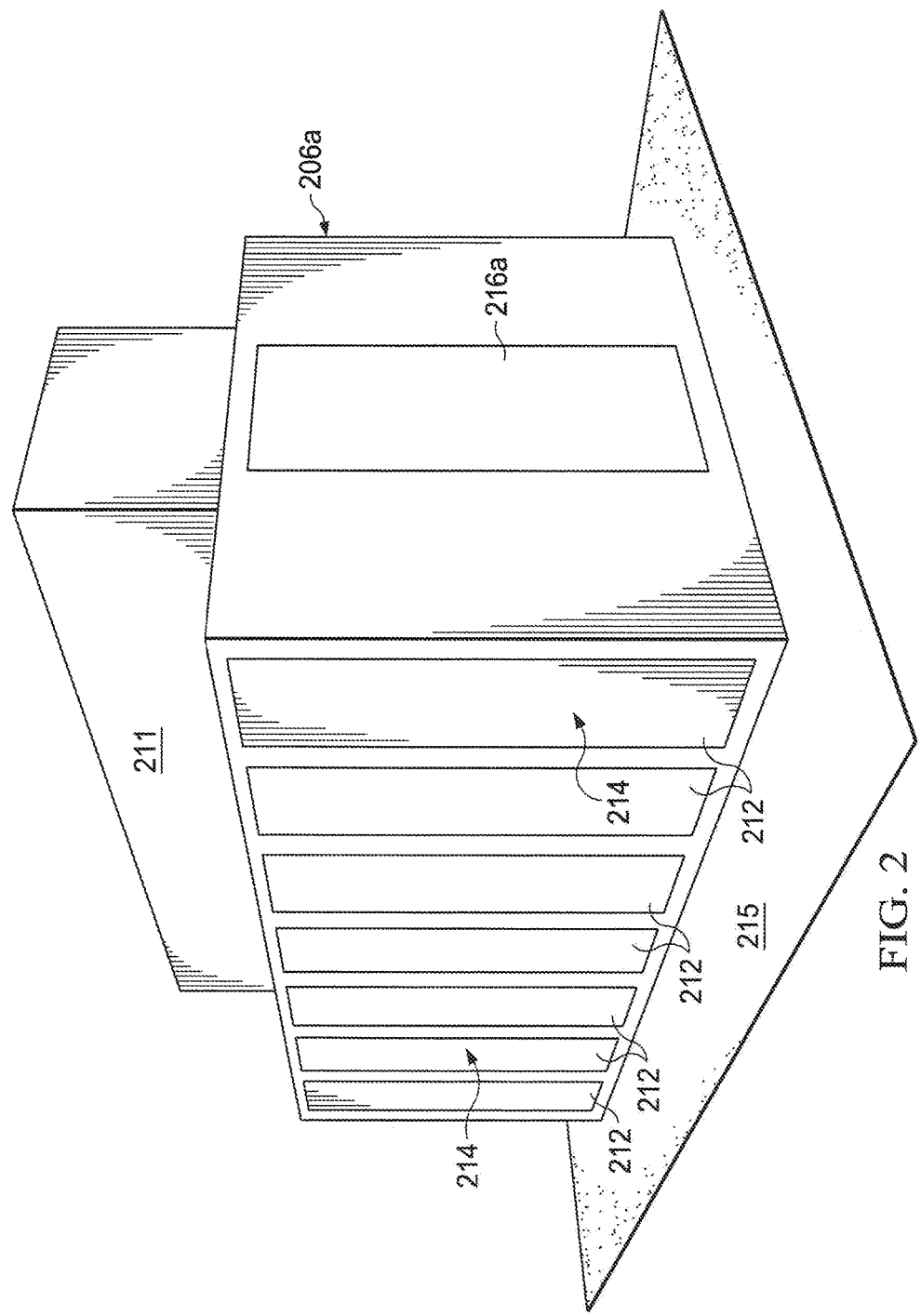
FIG. 2 is a perspective view of an exemplary server pod of a data center implementing an exemplary data center heat removal system disclosed herein.

FIG. 2 is a perspective view illustrating an exemplary server pod of a data center that houses a plurality of server banks (now shown). For clarity, only one server pod is shown. The data center of FIG. 2 may be an embodiment of the data center 100 shown in FIG. 1. In this example, a server pod 206a and an adjacent server pod (not shown) are separated by cold aisle 215. The sides of the server pod 206a include screened openings 212 for admitting cool air into the server pods 206a. As illustrated, the server pod 206a includes an access door 216a defining an opening to the hot aisle (not shown) inside the server pod 206a. In the example illustrated, the server pod hot aisle (inside the server pod 206a) extends from the ceiling of the server pod 206a to the ceiling of the data center via an enclosure or hood 211. The cold aisle 215 is pressurized with cool air which is then drawn through the racks of the server pod 206a, as illustrated by arrows 214. The air is then drawn out the top of the server pod 206a via the enclosed or sealed hood 211.

Figure 3:
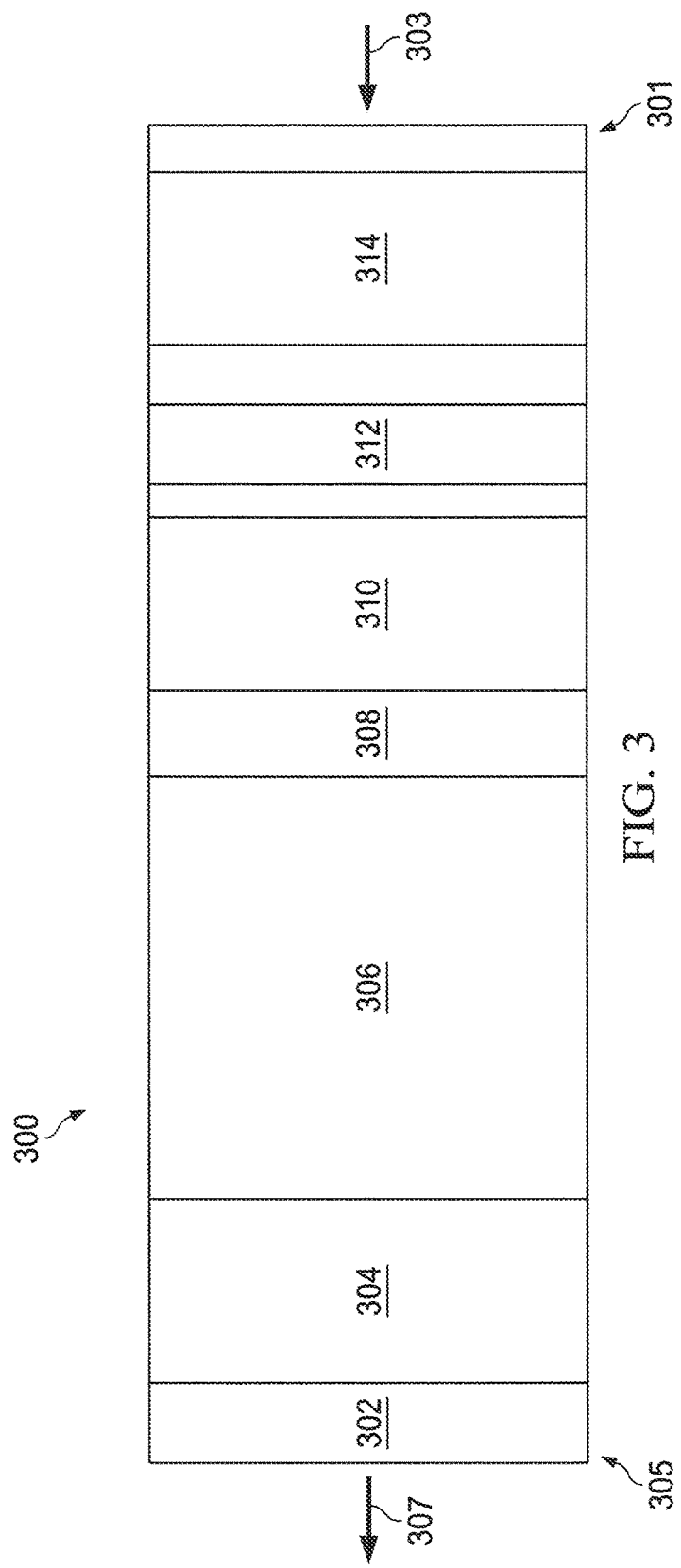
FIG. 3 is a block diagram of an exemplary arrangement of a chilling unit according to some embodiments.

As described above with respect to FIG. 1, a data center heat removal system may include one or more chilling units, such as the chilling unit 102. FIG. 3 is a block diagram of one exemplary arrangement of a chilling unit 300, which may be used in a data center according to some embodiments. The chilling unit 300 may include a structure or housing for housing the various components of the chilling unit, described below. In one example, a housing may comprise a shipping container housing, being approximately 20 feet long, 7'10" tall, and 7'8" wide according to one non-limiting example. Other types and sizes are may also be used.

In the exemplary chilling unit 300 shown in FIG. 3, the direction of air flow through the chilling unit 300 is shown by the arrows at each end of the chilling unit 300. Ambient air enters the chilling unit 300 at a first end 301 (as shown by the arrow 303) and exits at a second end 305 into the data center (as shown by the arrow 307). In the example illustrated in FIG. 3, the chilling unit 300 includes a first fan unit 314, a first filter 312, a second fan unit 310, a mister 308, a chiller unit 306, a third fan unit 304, and a second mister 302. In some embodiments, each of the components may be configured to extend across a cross section of the container. Further, in some embodiments, one or more of the components may not be necessary. For example, in some embodiments, the chiller unit 306 may not be required by a data center heat removal system disclosed herein (e.g., the data center 100 shown in FIG. 1) where the air outside a data center configured with the data center heat removal system is usually at a sufficiently cool temperature (e.g., depending upon the climate, location, and/or altitude at which the data center is located) that artificial cooling may not be necessary. Furthermore, in some embodiments, the humidity of the air may be such that only one mister is needed.

In some embodiments, the number and configuration of fan units in the chilling unit 300 may be chosen based on air flow requirements, as desired. In some embodiments, the fan units 314, 310, and 304 may each include four 44" drum fans capable of moving approximately 72,000 CFM of air. The control of the fan units is described in detail below. The filter units 312 may be implemented as four-stage Hepa filters in some embodiments.

In some embodiments, the chiller unit 306 may be configured to include chillers on both sides of the chilling unit 300, with coils that extend to meet each other at 45 degrees from the sides. In some embodiments, the coil units may be hinged such that, when not in use, they can swing to the sides of the chilling unit using motors.

In some embodiments of a data center heat removal system, various types of sensors can be placed in a data center to sense various conditions in the data center. In some embodiments, the sensed conditions are stored in a database and are used by a control system to control the operation of the components of the chilling unit and associated fans, vents, etc. (described below). The control system may be associated with the chilling unit 300 or the data center itself, or both. The sensors may include temperature sensors, humidity sensors, air flow sensors, pressure sensors, and/or other types of environmental sensors. In some embodiments, each chilling unit 300 may provide up to 60,000 CFM of air to the data center at or under 78 degrees. In other embodiments, each chill unit 300 may provide more or less capacity, as desired.

While the chilling unit 300 is pressurizing the data center, the variable speed ceiling fans (e.g., for the vents 117a and 117b of FIG. 1 or the hood 211 of FIG. 2) of the data center may be adjusted to keep the pressure in the hot aisles at lower than the cool side of the system. When the temperature is below a threshold value (e.g., 65 degrees), one of the fans may be slowed or shut off to decrease the pressure and the ceiling fan will slow to reduce amount of air that is being released.

Figure 4:
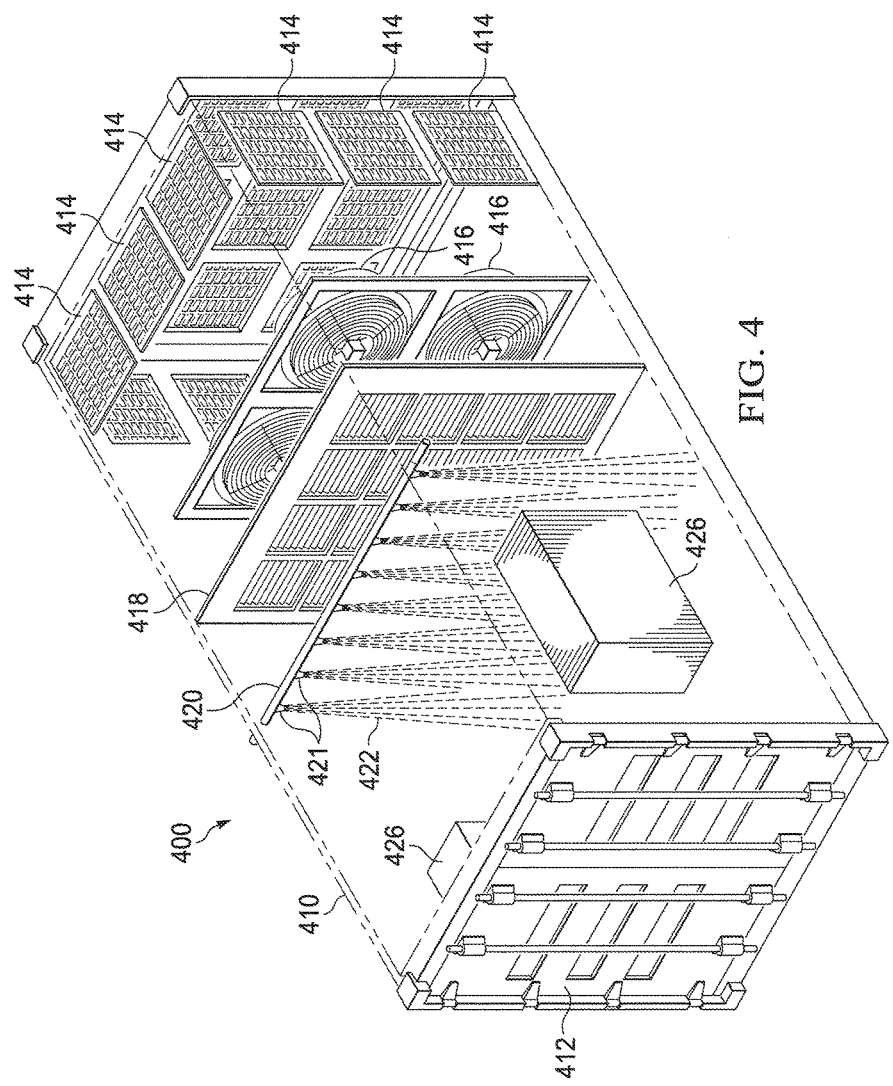
Figure 7:
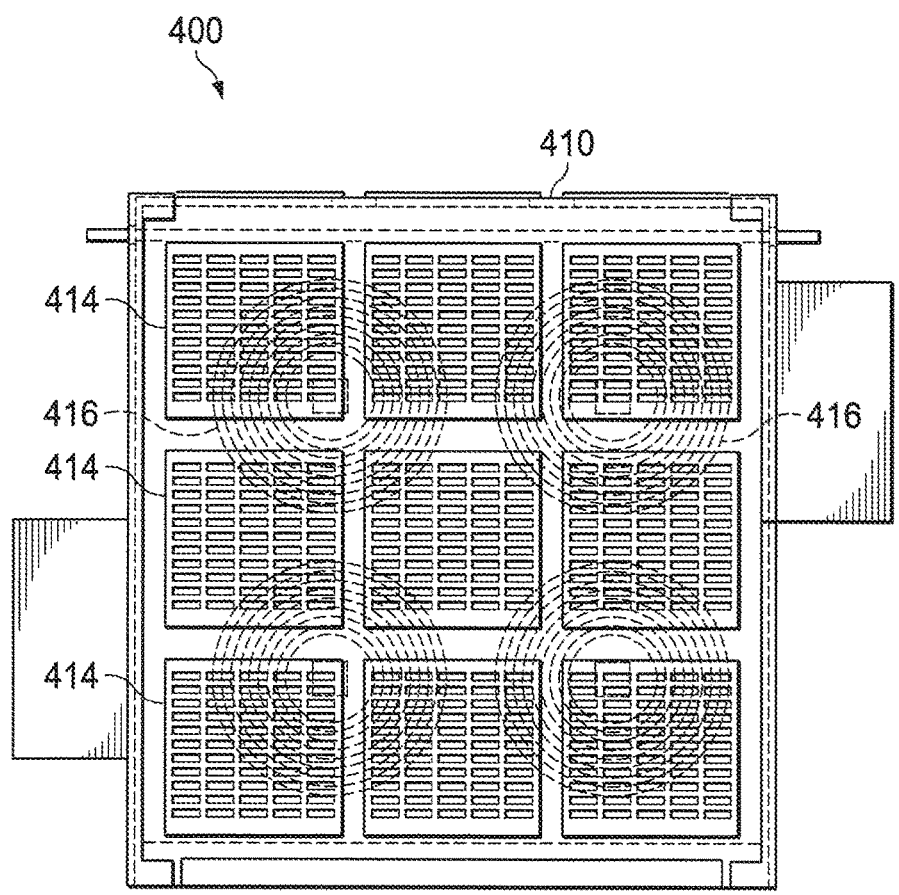

FIGS. 4-7 are views of an exemplary chilling unit according to some embodiments. Other configurations and layouts are also possible. In FIGS. 4-7, the housing walls are hidden to show the chilling unit components inside the housing. FIG. 4 is an isometric view of a chilling unit. Each of FIG. 5A, FIG. 5B, and FIG. 5C is a top view of the chilling unit shown in FIG. 4. FIG. 6 is a side view of the chilling unit shown in FIG. 4. FIG. 7 is an end view of the chilling unit shown in FIG. 4.

As mentioned above, in some embodiments, a chilling unit can be housed using a standard shipping container. A typical shipping container is comprised of a steel box having doors at one end. Although a standard shipping container works well as a chilling unit housing, a customized housing can also be used. In one example, a standard 20 foot freezer shipping container is used. In this example, an intake area (described below) is formed at one end of the container.

As shown in FIGS. 4-7, a chilling unit 400 includes a housing 410 having doors 412 at one end. During use of the chilling unit 400, the doors 412 are opened, or completely removed. In FIGS. 4-6, the direction of air flow through the chilling unit 400 is from right to left.

At the right end of the chilling unit 400 are a plurality of vents 414 that form openings in the housing 410 to allow air to be drawn into the chilling unit 400 from outside. In the example shown in FIG. 4, the vents 414 are formed on the end, and on 3 sides of the housing 410. Downstream from the vents 414 are one or more fans 416. In the example shown in FIGS. 4-7, four fans are arranged to substantially cover the cross-sectional area of the housing 410. More or fewer fans could be used. As described in more detail below, the fans 416 may be single or variable speed, and may be controlled together or independently. The fans 416 draw air into the chilling unit 400 via the vents 414, and force the air through filter(s) 418. In one example, the fans 416 are 42 inch drum fans, each capable of moving 18,200 cubic feet per minute (CFM) of air. In the example of FIGS. 4-7, four fans are placed in the intake side. In other examples (e.g., FIG. 3), four more fans are placed on the exhaust end of the housing 410. In one example, the filters are 3-stage heap filters angled at 45 degrees from both sides to provide more surface area.

Downstream from the filters 418 is a mister 420. In the example shown, the mister 420 comprises a series of mister nozzles 421 near the top of the housing 410 pointing downward. When the mister 420 is activated, a fine mist 422 of water is sprayed downward as the air flows through the chilling unit 400. Depending on the temperature and relative humidity, the mister 420 can lower the temperature of the air by approximately 10 degrees.

Figure 5A:
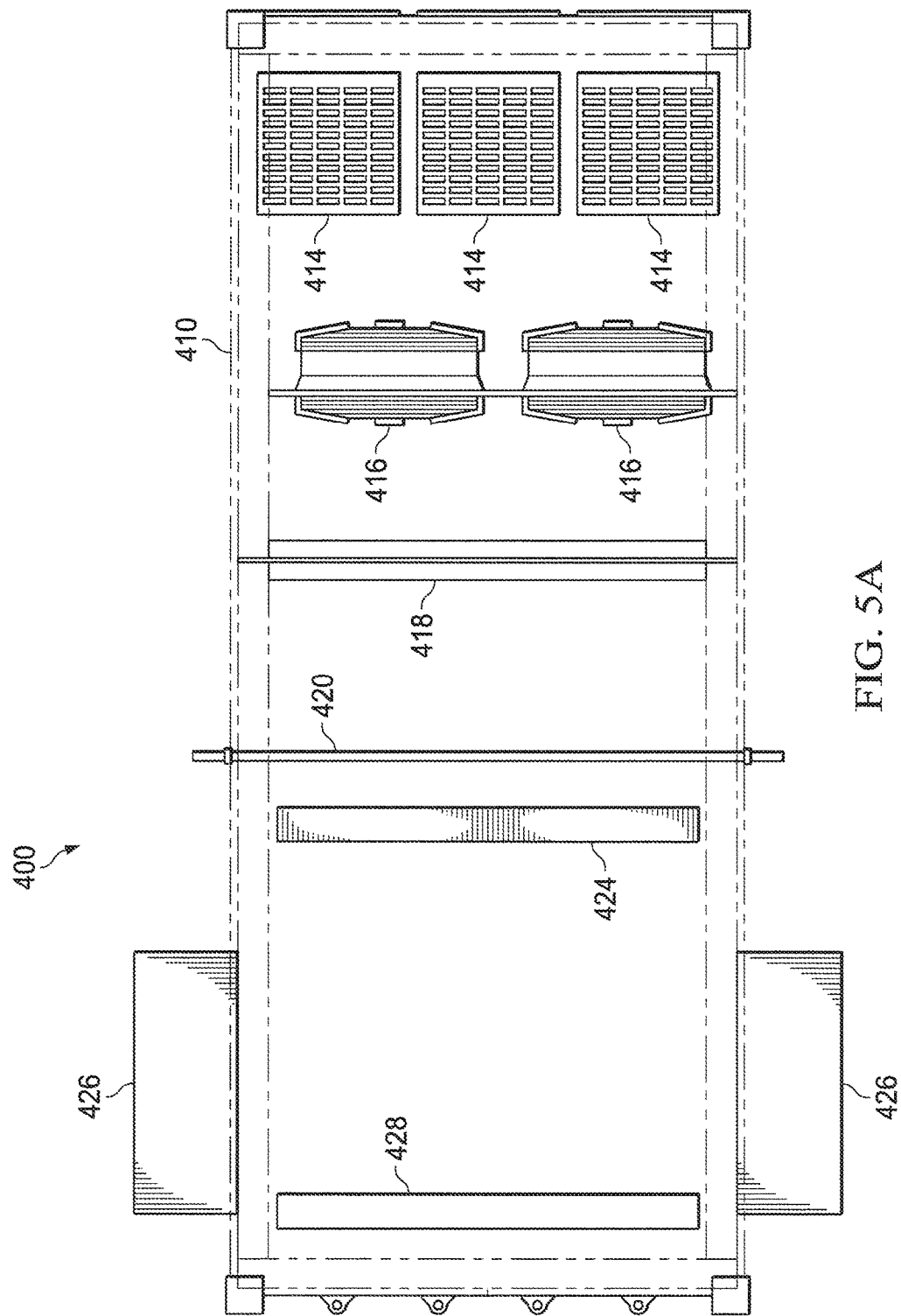
Figure 5B:
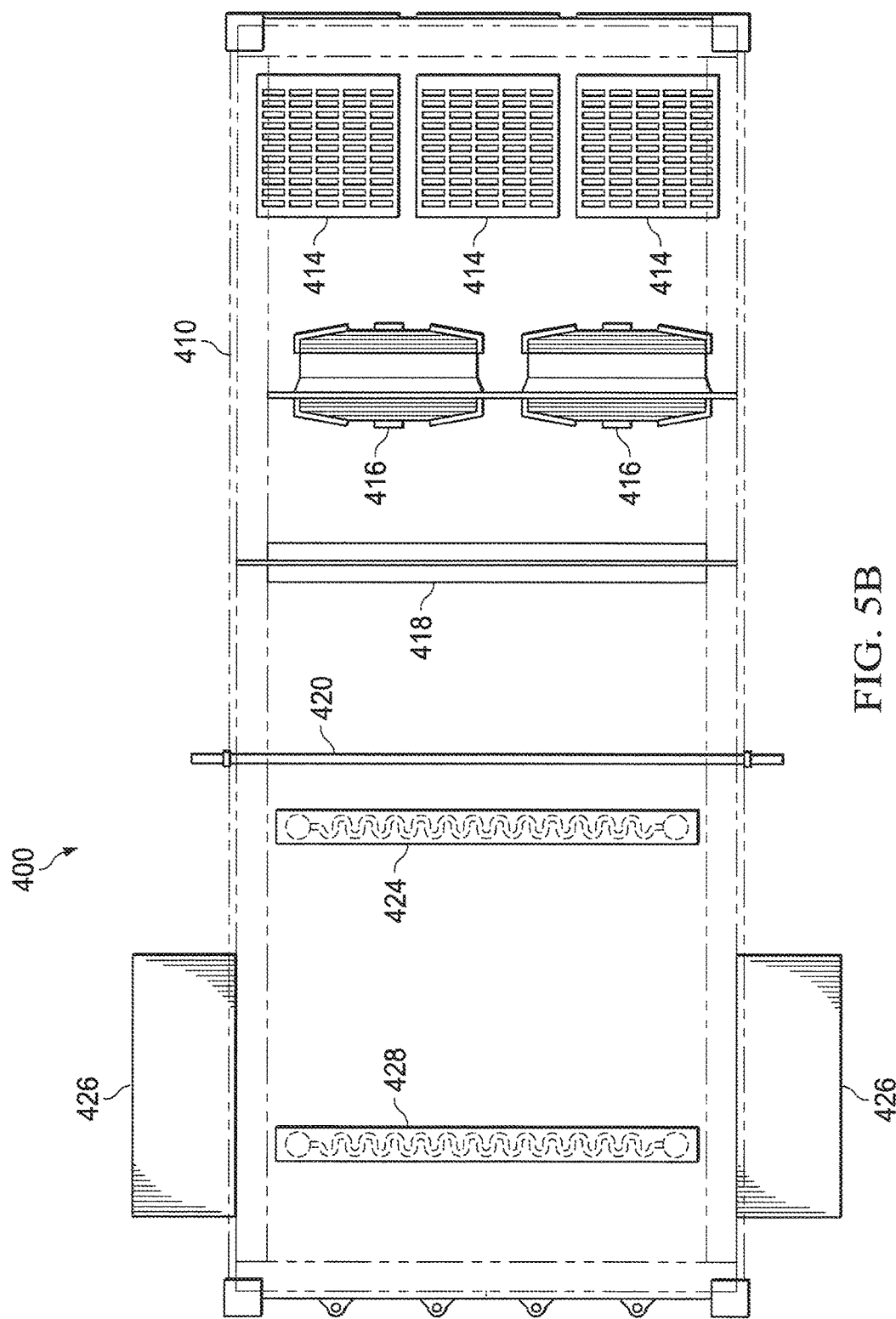
Figure 5C:
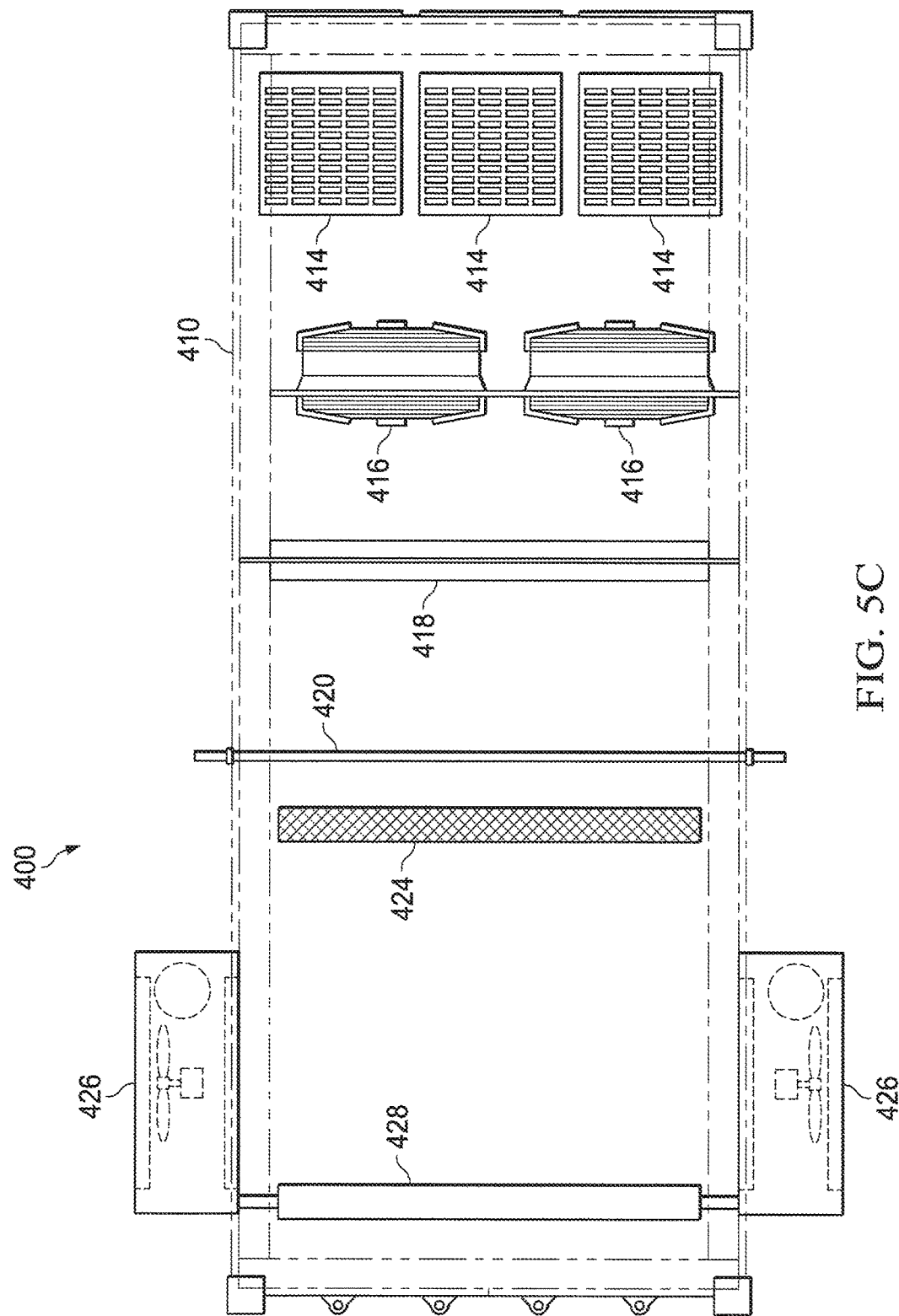

Downstream from the mister 420 are mister cooling elements 424. For clarity, the mister cooling elements 424 are not shown in FIG. 4, but are shown in FIGS. 5A-6. The mister cooling elements 424 are made of a metal material and help to cool the air even further by providing a surface for mist condensation. As the air flows through the mister cooling elements 424, the air is not only cooled by evaporating mist, but also by passing through the mister cooling elements 424. The mister cooling elements 424 can be any configuration that allows air to flow through, while providing a metal surface for mist condensation. Examples of the mister cooling elements 424 can include coils, a metal grate or mesh, etc., as one skilled in the art would understand.

Downstream from the mister 420 and the mister cooling elements 424 are a pair of chillers 426 mounted on opposite walls of the housing 410. The chillers 426 can be conventional off-the-shelf air-conditioning or freezer units configured to chill the air. If the air needs to be further cooled, one or more of the chillers 426 can be turned on. FIGS. 5A-6 also show freezer elements such as freezer coils 428 disposed within the housing 410 between the chillers 426. The freezer elements 428 are extensions of piping from the chillers 426 extending into the chiller unit 400 to improve heat transfer with the air. In one example, the freezer elements 428 are configured to extend out at a 45 degree angle from the sides of the housing 410. In one example, the freezer elements 428 are movable to automatically swing back against the interior wall of the housing 410 when not in use.

Note that the configuration of a chilling unit can take on many configurations, as desired. For example, the chilling unit 300 shown in FIG. 3 has three sets of fans and two sets of misters. Depending on various factors, such as local climate, data center size, cost limitations, etc., a chilling unit can be configured in such a way as to balance desired performance and cost.

Figure 8:
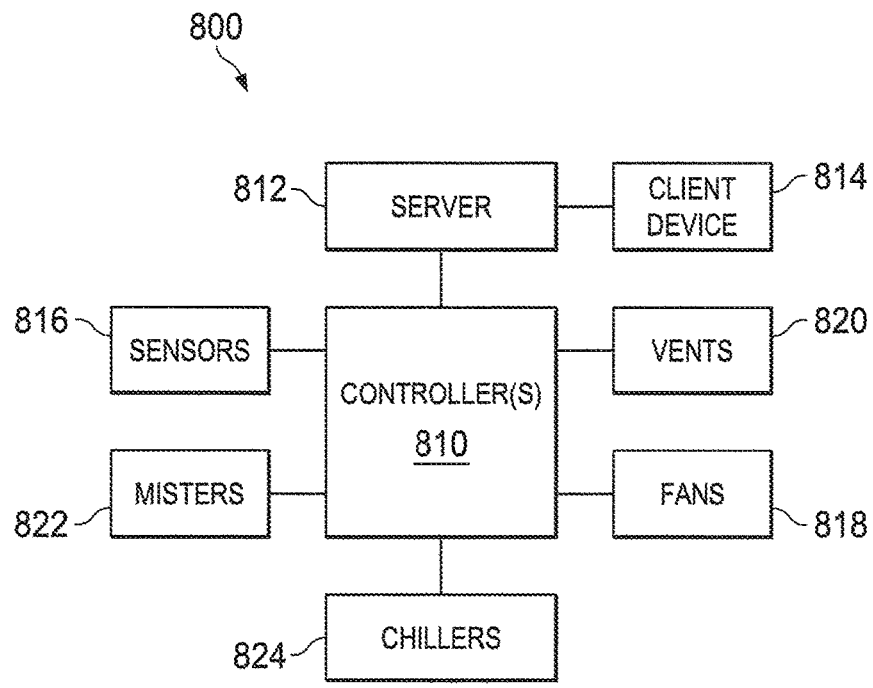
FIG. 8 is a block diagram illustrating an exemplary data center heat removal system configured to maintain a desired temperature in a data center according to some embodiments.

As mentioned above, the temperature of a data center can be controlled and maintained by sensing various conditions in the data center and controlling various components of a system accordingly. FIG. 8 is a block diagram illustrating a system 800 that is configured to maintain a desired data center temperature in the most energy efficient manner possible. The system 800 has a controller 810 capable of interfacing and controlling the various components of the system 800. The controller 810 may be comprised of a single device that interfaces with the components of the system 800, or may include multiple devices working together. For example, a data center may have separate fan controllers, chiller controllers, etc. In one example, a web-based application runs on a server 812 and controls the operation of the controller 810. One or more client devices 814 can be used by a technician to configure and monitor the controller via the web-based application.

The system 800 uses a plurality of sensors 816 to sense various conditions in the data center. The sensors may include temperature sensors, humidity sensors, air flow sensors, and/or pressure sensors, and any other desired sensors. The temperature sensors may sense the temperature in the hot isles, cold isles, server pods, chilling units, exhaust vents, individual servers, etc. The ambient temperature can also be sensed outdoors or at the intake portion of the chilling unit. Similarly, humidity sensors can also sense the humidity anywhere in the data center, as desired. Pressure sensors sense air pressure at various places in the data center. By monitoring the air pressure throughout the data center, a desired air flow through the system can be maintained. In one example, the air pressure is sensed in the cold isles, hot isles, and exhaust vents. The system 800 may also use any other type of sensor desired.

The system 800 controls the operation of the fans 818 of the system to maintain a desired air flow throughout the system. For example, a data center may have fans in the chilling units (e.g., fans 416 in FIG. 4) and in the exhaust vents (e.g., vents 117a and 117b in FIG. 1). The controller 810 controls whether the fans are on or off, as well as controlling their speed, when variable speed fans are used. The controller 810 is capable of determining how to most efficiently use the fans to maintain a desired air flow, and thus temperature. For example, if a given amount of air flow is needed to maintain a target temperature, the controller can selectively activate individual fans, and control them at desired speed(s) to achieve a desired airflow using the least amount of electricity possible.

The system 800 can also control the opening and closing of vents 820 in the system, if the system is equipped with closable vents. For example, the intake vents of the chilling units may include louvers that can be opened and closed by the controller 810. Similarly, the exhaust vents can be opened and closed by the controller 810. The vents 820 can not only be opened and closed, but can be opened a desired amount, to further control the amount of air flow through the vents 820.

The system 800 also controls the operation of the misters 822 (e.g., misters 420 in FIG. 4) of the system to lower the air temperature in the system. As described above, activating the misters 822 can, under the right conditions, lower the air temperature by approximately 10 degrees. The misters 822 have the most effect in low-humidity conditions. By knowing the humidity of the air, the controller 810 can determine when activating the misters 822 will have a beneficial effect.

The system 800 also controls the operation of the chiller units 824 (e.g., chillers 426 in FIG. 4) of the system to lower the air temperature. By activating the chiller units 824, the air temperature can be significantly lowered to help achieve a desired air temperature.

The controller 810 may also control various other components, as desired. In addition, the controller 810 and web-based application can monitor, log, and report various aspects of the operation of the system 800. The system 800 may include monitors, visual indicators, alarms, etc., either via client devices or standalone indicators and devices, to allow users or technicians to monitor the operation of the system 800.

The system 800 is controlled to achieve a desired target temperature in the server pods in the most efficient manner possible. The dominate factor that determines the cost of cooling a data center of electricity usage. The various components of the system 800 that contribute to lowering air temperatures each use different amounts of electricity. Therefore, the controller 810 is configured to achieve and maintain a target temperature by controlling the system components in such a way that electricity usage is minimized.

A goal of the controller is to maintain a desired target temperature, using the least possible amount of electricity. When the chiller units may use significantly more power than the fans and misters, the controller will try to maintain the desired target temperature without using the chiller units, or at least minimizing the use of the chiller units. Similarly, the controller will selectively activate and control the speed of the fans to achieve a desired airflow using the least amount of power.

In one example, the controller 810 uses an algorithm to control the system. The algorithm may, when possible, maintain a desired target temperature without using the chiller units 824. For example, under the right conditions, the desired target temperature can be maintained by controlling the activation and speed of the fans 818 alone. Under the right conditions (e.g., a relatively low humidity level), the misters 822 may be used with the fans. Use of the misters 822 may allow fans usage to be reduced, further lowering power usage.

The control algorithm, via the sensors, knows the conditions (e.g., temperature, humidity, air pressure differentials) in the system, and can control the system accordingly. For example, assume that an X degree temperature drop is needed. Knowing the outside ambient air temperature, the various temperatures in the system, and the relative air pressures in the system, the controller can determine that Y cubic feet of air flow is needed to reach the desired target temperature. The controller then selectively activates and controls the speed of the fans in the system to achieve the determined air flow rate. The controller also takes into account how activation of the misters will affect the air temperature, and thus the desired air flow rate. When the sensed conditions indicate that use of the misters would be beneficial, the misters will be activated. As a result, the controller can maintain the desired target temperature using a combination of fans and the misters in the most efficient way possible, preferably without relying on the chiller units. If the outside ambient temperature is high enough (perhaps 78 degrees, in one example), the desired target temperature may not be achievable with fans and mister alone. When that is the case, the controller will turn on one or more of the chiller units to bring the air temperature down to the desired target level.

Figure 9:
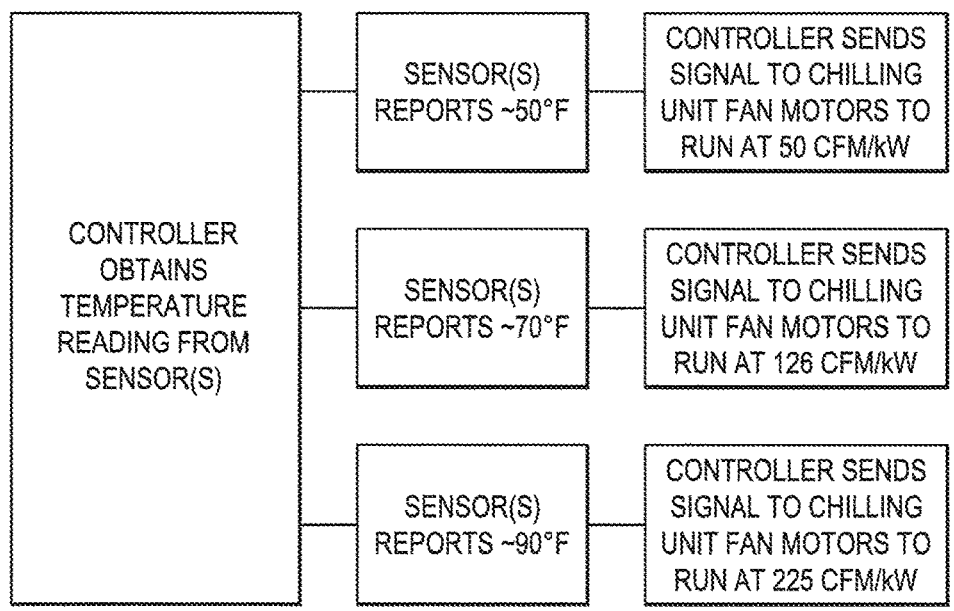
FIG. 9 is a logical control diagram for an exemplary data center heat removal system according to some embodiments.

FIG. 9 is a logical control diagram illustrating an example of the control of the fans (e.g., fans 416 in FIG. 4) in a chilling unit based on a sensed condition. In the example illustrated in FIG. 9, the controller controls the amount of air flow through the system based on the temperature of the air at the intake of the chilling unit. In general, cooler air requires less air flow to cool the data center, while warmer air requires more air flow to cool the data center.

As shown in FIG. 9, the controller obtains a temperature reading from one or more temperature sensors. The temperature sensor(s) may be located at the intake of the chilling unit, outside of the chilling unit, or at any other suitable location. In this example, if the sensor reports an air temperature of approximately 50 degrees Fahrenheit, the controller sends a digital signal to the chilling unit fans to run at 50 CFM/kW. As indicated by the air flow rate values in FIG. 9, the desired flow rate also depends on the amount of power being consumed in the data center, in this example, 50 CFM/kW. In other words, when more power is being consumed by the data center, more heat is generated, and therefore, more air flow is needed. The desired flow rate can be achieved by selectively activating fans, as well as setting the speed of the activated fans. In some examples, the air flow rate may be fine-tuned by also controlling exhaust fans. If the sensor reports an air temperature of approximately 70 degrees Fahrenheit, the controller sends a digital signal to the chilling unit fans to run at 126 CFM/kW. If the sensor reports an air temperature of approximately 90 degrees Fahrenheit, the controller sends a digital signal to the chilling unit fans to run at 225 CFM/kW.

Other components of the system (e.g., misters, coolers, etc.) can be controlled in a similar manner based on any desired sensed conditions, as one skilled in the art would understand. Also note that the activation of different components of the system may affect each other. For example, if the misters are activated, a lower air flow rate may be desired, compared to a desired air flow rate without the misters.

Note that it is important to not only lower the temperature of a data center to a desired level, but to not let the temperature drop too far below the desired level. The reliability of some server equipment relies on a relatively constant temperature. Therefore, in some conditions (e.g., winter months), the outside ambient air will be cool enough that the controller will restrict air flow to keep the air temperature up to the desired target value.

The systems described above can be built into a new data center or retrofitted into an existing data center. In an example where a system is retrofitted into an existing data center, one or more chilling units can each be installed in an opening formed in a data center wall, as illustrated in FIG. 1. In each hot isle, an exhaust vent/hood (e.g., vents 117a and 117b in FIG. 1) is created to draw hot air out of the data center. A controller and various sensors (e.g., temperature, humidity, and/or pressure, etc.) can also be installed to monitor and control the operation of the system.

These, and other, aspects of the disclosure and various features and advantageous details thereof are explained more fully with reference to the exemplary, and therefore non-limiting, embodiments illustrated herein. It should be understood, however, that the detailed description and the specific examples, while indicating the preferred embodiments, are given by way of illustration only and not by way of limitation. Descriptions of known programming techniques, computer software, hardware, operating platforms and protocols may be omitted so as not to unnecessarily obscure the disclosure in detail. Various substitutions, modifications, additions and/or rearrangements within the spirit and/or scope of the underlying inventive concept will become apparent to those skilled in the art from this disclosure.

Some embodiments described herein can be implemented in the form of control logic in software or hardware or a combination of both. The control logic may be stored in an information storage medium, such as a computer-readable medium, as a plurality of instructions adapted to direct an information processing device to perform a set of steps disclosed in the various embodiments. Based on the disclosure and teachings provided herein, a person of ordinary skill in the art will appreciate other ways and/or methods to implement the invention.

It is also within the spirit and scope of the invention to implement in software programming or code the steps, operations, methods, routines or portions thereof described herein, where such software programming or code can be stored in a computer-readable medium and can be operated on by a processor to permit a computer to perform any of the steps, operations, methods, routines or portions thereof described herein. The invention may be implemented by using software programming or code in one or more control systems, by using application specific integrated circuits, programmable logic devices, field programmable gate arrays, optical, chemical, biological, quantum or nanoengineered systems, components and mechanisms, various types of sensors including temperature, humidity, and/or pressure sensors may be used. The functions of the invention can be achieved by various means including distributed, or networked systems, hardware components, and/or circuits. In another example, communication or transfer (or otherwise moving from one place to another) of data may be wired, wireless, or by any other means.

A "computer-readable medium" may be any medium that can contain, store, communicate, propagate, or transport the program for use by or in connection with the instruction execution system, apparatus, system or device. The computer readable medium can be, by way of example only but not by limitation, an electronic, magnetic, optical, electro-magnetic, infrared, or semiconductor system, apparatus, system, device, propagation medium, or computer memory. Such computer-readable medium shall be machine readable and include software programming or code that can be human readable (e.g., source code) or machine readable (e.g., object code). Examples of non-transitory computer-readable media can include random access memories, read-only memories, hard drives, data cartridges, magnetic tapes, floppy diskettes, flash memory drives, optical data storage devices, compact-disc read-only memories, and other appropriate computer memories and data storage devices. In an illustrative embodiment, some or all of the software components may reside on a single server computer or on any combination of separate server computers. As one skilled in the art can appreciate, a computer program product implementing an embodiment disclosed herein may comprise one or more non-transitory computer readable media storing computer instructions translatable by one or more processors in a computing environment.

A "processor" includes any, hardware system, mechanism or component that processes data, signals or other information. A processor can include a system with a central processing unit, multiple processing units, dedicated circuitry for achieving functionality, or other systems. Processing need not be limited to a geographic location, or have temporal limitations. For example, a processor can perform its functions in "real-time," "offline," in a "batch mode," etc. Portions of processing can be performed at different times and at different locations, by different (or the same) processing systems.

Those skilled in the art will appreciate that a suitable control system can include a central processing unit ("CPU"), at least one read-only memory ("ROM"), at least one random access memory ("RAM"), at least one hard drive ("HD"), and one or more input/output ("I/O") device(s). The I/O devices can include a keyboard, monitor, printer, electronic pointing device (for example, mouse, trackball, stylus, touch pad, etc.), or the like. In embodiments of the invention, the control system can have access to at least one database over a network connection.

ROM, RAM, and HD are computer memories for storing computer-executable instructions executable by the CPU or capable of being compiled or interpreted to be executable by the CPU. Suitable computer-executable instructions may reside on a computer readable medium (e.g., ROM, RAM, and/or HD), hardware circuitry or the like, or any combination thereof. Within this disclosure, the term "computer readable medium" is not limited to ROM, RAM, and HD and can include any type of data storage medium that can be read by a processor. Examples of computer-readable storage media can include, but are not limited to, volatile and non-volatile computer memories and storage devices such as random access memories, read-only memories, hard drives, data cartridges, direct access storage device arrays, magnetic tapes, floppy diskettes, flash memory drives, optical data storage devices, compact-disc read-only memories, and other appropriate computer memories and data storage devices. Thus, a computer-readable medium may refer to a data cartridge, a data backup magnetic tape, a floppy diskette, a flash memory drive, an optical data storage drive, a CD-ROM, ROM, RAM, HD, or the like.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, product, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, including the accompanying appendices, a term preceded by "a" or "an" (and "the" when antecedent basis is "a" or "an") includes both singular and plural of such term, unless clearly indicated otherwise (i.e., that the reference "a" or "an" clearly indicates only the singular or only the plural). Also, as used in the description herein and in the accompanying appendices, the meaning of "in" includes "in" and "on" unless the context clearly dictates otherwise.

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized encompass other embodiments as well as implementations and adaptations thereof which may or may not be given therewith or elsewhere in the specification and all such embodiments are intended to be included within the scope of that term or terms. Language designating such non-limiting examples and illustrations includes, but is not limited to: "for example," "for instance," "e.g.," "in one embodiment," and the like.

Those skilled in the art of the invention will recognize that the disclosed embodiments have relevance to a wide variety of areas in addition to the specific examples described above. For example, although the examples above are described in the context of data centers, some embodiments disclosed herein can be adapted or otherwise implemented to work in other types of environments, circumstances, etc. In this context, the specification and figures are to be regarded in an illustrative rather than a restrictive sense, and all such modifications are intended to be included within the scope of this disclosure. Accordingly, the scope of the present disclosure should be determined by the following claims and their legal equivalents.

What is claimed is:

1. A system for removing heat and cooling the air in a data center environment, the system comprising:
    a housing having an intake end and an exhaust end;
    one or more fans disposed within the housing for directing air to flow through the housing from the intake end to the exhaust end;
    a mister having nozzles for spraying mist to cool the air in the housing;
    at least one mister cooling element disposed downstream from the mister and structured to allow air to flow through, the at least one mister cooling element having a metal surface configured for mist condensation which further cools the air in the housing;
    at least one chiller unit positioned downstream from the at least one mister cooling element for further cooling the air flowing through the at least one mister cooling element; and
    at least one freezer element extending from the at least one chiller unit and disposed within the housing proximate the exhaust end.

2. The system of claim 1, wherein the housing is comprised of a shipping container.

3. The system of claim 1, wherein the at least one mister cooling element comprises metal coils.

4. The system of claim 1, further comprising a controller implementing a control algorithm for managing and controlling operations of the one or more fans, the mister, the at least one mister cooling element, and the at least one chiller unit.

5. The system of claim 4, further comprising a plurality of sensors communicatively connected to the controller for sensing environmental conditions in the data center environment and providing readings reflective of sensed environmental conditions in the data center environment to the controller.

6. The system of claim 5, wherein the controller manages and controls the operations based on the sensed environmental conditions in the data center environment.

7. The system of claim 1, wherein the one or more fans include at least one variable speed fan.

8. The system of claim 1, wherein the data center environment includes a data center having at least one server pod and a cold aisle, the at least one server pod having screened openings facing the cold aisle, at least one server bank, and a hot aisle, wherein air in the hot aisle is heated by the at least one server bank inside the at least one server pod, wherein air from the exhaust end of the housing is directed to the cold aisle of the data center, wherein the system further comprises at least one vent enclosed in the at least one server pod for venting the air in the hot aisle, the venting causing cool air to be drawn from the cold aisle, through the screened openings and the at least one server bank, and into the hot aisle inside the at least one server pod.

9. A method for removing heat and cooling the air in a data center environment, the method comprising:
   providing a chilling unit, the chilling unit comprising:
      a housing having an intake end and an exhaust end;
      one or more fans disposed within the housing for directing air to flow through the housing from the intake end to the exhaust end;
      a mister having nozzles for spraying mist to cool the air in the housing;
      at least one mister cooling element disposed downstream from the mister and structured to allow air to flow through, the at least one mister cooling element having a metal surface configured for mist condensation which further cools the air in the housing;
      at least one chiller unit positioned downstream from the at least one mister cooling element for further cooling the air flowing through the at least one mister cooling element; and
      at least one freezer element extending from the at least one chiller unit and disposed within the housing proximate the exhaust end;
   sensing, via a plurality of sensors communicatively connected to a controller, environmental conditions including temperatures, air pressures, and humidity at a plurality of locations in the data center environment; and
   controlling, by the controller, operations of the one or more fans, the mister, the at least one mister cooling element, and the at least one chiller unit based on the sensed environmental conditions including temperatures, air pressures, and humidity at the plurality of locations in the data center environment.

10. The method according to claim 9, wherein the controlling comprises:
    determining, by the controller, a desired air flow rate; and
    selectively activating the one or more fans and setting a speed for each of the activated fans based on the determined desired air flow rate.

11. The method according to claim 9, wherein the controlling comprises:
    activating the mister, by the controller, when the sensed temperature and sensed humidity indicate to the controller that the mister would be effective in lowering air temperature.

12. The method according to claim 9, wherein the controlling comprises:
    sensing the temperature at the intake end of the housing; and
    activating, by the controller, the at least one chiller unit if the sensed temperature at the intake end of the housing is above a threshold value.

13. The method according to claim 9, wherein the controlling comprises:
    determining, by the controller, a desired air flow rate;
    sensing air pressure at a data center exhaust location;
    sensing air pressure at a data center intake location; and
    selectively activating one or more variable speed fans and setting a speed for each activated variable speed fan based on the sensed air pressures at the data center exhaust and intake locations.

14. A method for retrofitting a system for removing heat and cooling the air in a data center environment, the method comprising:
    providing a chilling unit, the chilling unit comprising:
       a housing having an intake end and an exhaust end;
       one or more fans disposed within the housing for directing air to flow through the housing from the intake end to the exhaust end;
       a mister having nozzles for spraying mist to cool the air in the housing;
       at least one mister cooling element disposed downstream from the mister and structured to allow air to flow through, the at least one mister cooling element having a metal surface configured for mist condensation which further cools the air in the housing;
       at least one chiller unit positioned downstream from the at least one mister cooling element for further cooling the air flowing through the at least one mister cooling element; and
       at least one freezer element extending from the at least one chiller unit and disposed within the housing proximate the exhaust end;
    placing a plurality of sensors in the data center environment;
    communicatively connecting the plurality of sensors to a controller implementing a control algorithm for controlling the one or more fans, the mister, the at least one mister cooling element, and the at least one chiller unit;
    placing the chilling unit in the data center environment with the intake end of the housing of the chilling unit exposed outside of the data center environment;
    placing the exhaust end of the housing of the chilling unit inside the data center environment and in communication with a cold isle proximate at least one server pod;
    sensing, via the plurality of sensors communicatively connected to the controller, environmental conditions in the data center environment; and
    controlling, by the controller, operations of the one or more fans, the mister, the at least one mister cooling element, and the at least one chiller unit based on the sensed environmental conditions in the data center environment.

15. The method according to claim 14, wherein the at least one server pod comprises screened openings facing the cold aisle, at least one server bank, and a hot aisle, wherein air in the hot aisle is heated by the at least one server bank inside the at least one server pod, wherein venting the air in the hot aisle causes cool air to be drawn from the cold aisle, through the screened openings and the at least one server bank, and into the hot aisle inside the at least one server pod.

16. The method according to claim 15, further comprising:
    providing an enclosed or sealed exhaust vent hood for the at least one server pod, the enclosed or sealed exhaust vent hood structured for directing air to vent from the hot aisle inside the at least one server pod.

17. The method according to claim 14, wherein the controller is configured to selectively activate one or more variable speed fans and set a speed for each activated variable speed fan based on the sensed environmental conditions in the data center environment.

18. The method according to claim 14, wherein the controller is configured to selectively activate the mister based on the sensed environmental conditions in the data center environment.

19. The method according to claim 14, wherein the controller is configured to selectively activate the at least one chiller unit based on the sensed environmental conditions in the data center environment.

* * * * *

UNITED STATES PATENT AND TRADEMARK OFFICE
CERTIFICATE OF CORRECTION

PATENT NO. : 9,769,960 B2
APPLICATION NO. : 14/984149
DATED : September 19, 2017
INVENTOR(S) : Dale LeFebvre and Kenneth Choi Page 1 of 1

It is certified that error appears in the above-identified patent and that said Letters Patent is hereby corrected as shown below:

In the Specification

At Column 7, Line 28, delete "isles" after the word hot and insert -- aisles --

At Column 7, Line 28, delete "isles" after the word cold and insert -- aisles --

At Column 7, Line 36, delete "isles" and insert -- aisles --

At Column 7, Line 37, delete "isles" and insert -- aisles --

At Column 9, Line 55, delete "isle" and insert -- aisle --

Signed and Sealed this
Twentieth Day of October, 2020

Andrei Iancu
*Director of the United States Patent and Trademark Office*